United States Patent
Arnz

(10) Patent No.: US 8,457,411 B2
(45) Date of Patent: Jun. 4, 2013

(54) METHOD AND DEVICE FOR DETERMINING THE POSITION OF AN EDGE OF A MARKER STRUCTURE WITH SUBPIXEL ACCURACY IN AN IMAGE, HAVING A PLURALITY OF PIXELS, OF THE MARKER STRUCTURE

(75) Inventor: Michael Arnz, Oberkochen (DE)

(73) Assignee: Carl Zeiss SMS GmbH, Jena (DE)

( * ) Notice: Subject to any disclaimer, the term of this patent is extended or adjusted under 35 U.S.C. 154(b) by 669 days.

(21) Appl. No.: 12/749,938

(22) Filed: Mar. 30, 2010

(65) Prior Publication Data
US 2010/0254611 A1 Oct. 7, 2010

Related U.S. Application Data

(60) Provisional application No. 61/164,517, filed on Mar. 30, 2009.

(30) Foreign Application Priority Data

Mar. 30, 2009 (DE) .......................... 10 2009 015 594

(51) Int. Cl.
*G06K 9/00* (2006.01)
(52) U.S. Cl.
USPC ............ 382/199; 382/144; 382/147; 382/190
(58) Field of Classification Search
USPC .................................. 382/144–147, 190, 199
See application file for complete search history.

(56) References Cited

U.S. PATENT DOCUMENTS

| | | | | |
|---|---|---|---|---|
| 6,002,793 A | * | 12/1999 | Silver et al. | 382/152 |
| 6,061,467 A | * | 5/2000 | Michael | 382/151 |
| 6,072,898 A | * | 6/2000 | Beaty et al. | 382/146 |
| 6,175,644 B1 | * | 1/2001 | Scola et al. | 382/141 |
| 6,920,249 B2 | | 7/2005 | Rinn et al. | |

(Continued)

FOREIGN PATENT DOCUMENTS

| | | |
|---|---|---|
| DE | 100 47 211 | 5/2002 |
| DE | 10 2006 059 431 | 6/2008 |

OTHER PUBLICATIONS

German Search Report for German Application No. 10 2009 015 594.5 dated Nov. 9, 2009.

*Primary Examiner* — Wesley Tucker
(74) *Attorney, Agent, or Firm* — Fish & Richardson P.C.

(57) ABSTRACT

The position of an edge of a marker structure in an image of the marker structure is determined with subpixel accuracy. A discrete intensity profile of the edge, having profile pixels, is derived from the image pixels, and a continuous profile function of the edge is determined based on the profile pixels. Profile pixels whose intensity values are near an intensity threshold value are selected as evaluation pixels. Based on the evaluation pixels, a curve of continuous intensity is calculated. A position coordinate at which the intensity value of the continuous intensity curve matches the threshold value is selected as a first position coordinate, and the distance is determined between the first position coordinate and the position coordinate of the evaluation pixel that, from among the evaluation pixels previously selected, has the closest intensity value to the threshold value. The determined distance is compared to a predetermined threshold, and if the distance is greater than the threshold, a shift is effected, and the process iteratively performs the steps of selects the adjacent profile pixels, calculates the curve of continuous intensity, and so forth. If the distance is not greater than the threshold, the position of the edge in the captured image is determined with subpixel accuracy from all the distances determined in step g).

22 Claims, 8 Drawing Sheets

U.S. PATENT DOCUMENTS

| | | |
|---|---|---|
| 6,928,182 B1 | 8/2005 | Chui |
| 6,928,196 B1 | 8/2005 | Bradley et al. |
| 7,003,161 B2 * | 2/2006 | Tessadro ................. 382/199 |
| 7,030,351 B2 * | 4/2006 | Wasserman et al. ....... 250/201.3 |
| 2003/0095700 A1 * | 5/2003 | Yu et al. .................. 382/154 |
| 2003/0206667 A1 * | 11/2003 | Wang et al. ............... 382/300 |
| 2005/0031191 A1 * | 2/2005 | Venkatachalam ........... 382/152 |
| 2006/0093205 A1 * | 5/2006 | Bryll et al. ................ 382/152 |
| 2007/0183666 A1 | 8/2007 | Ding |
| 2012/0328181 A1 * | 12/2012 | Kitamura et al. ........... 382/145 |

* cited by examiner

METHOD AND DEVICE FOR DETERMINING THE POSITION OF AN EDGE OF A MARKER STRUCTURE WITH SUBPIXEL ACCURACY IN AN IMAGE, HAVING A PLURALITY OF PIXELS, OF THE MARKER STRUCTURE

CROSS REFERENCE TO RELATED APPLICATION

Pursuant to 35 U.S.C. §119, this application claims the benefit of U.S. provisional application No. 61/164,517, filed on Mar. 30, 2009, and German patent application no. 10 2009 015 594.5, filed on Mar. 30, 2009. The contents of the prior applications are incorporated herein by reference in their entirety.

TECHNICAL FIELD

This document generally relates to a process or a device for determining, with subpixel accuracy, the position of an edge of a marker structure in a captured image of the marker structure.

BACKGROUND

In photolithography, it is useful to position marker structures on a lithographic mask with high accuracy. The position of the marker structures can be performed based on images of the marker structures. Noise present in the image may cause uncertainty or error during the position determination.

SUMMARY

In general, in one aspect, a process and a device are provided for determining, with subpixel accuracy, the position of a marker structure in a captured image of the marker structure having image pixels, by means of which the desired position determination can be performed quickly with high accuracy.

In general, in another aspect, a process for determining, with subpixel accuracy, the position of an edge of a marker structure in a captured image of the marker structure having image pixels is provided, wherein a) a discrete intensity profile of the edge, having profile pixels, is derived from the image pixels along a position coordinate, b) a continuous profile function of the edge as a function of the position coordinate is calculated on the basis of the profile pixels, c) an intensity threshold value defining the edge position is specified, d) from the profile pixels, adjacent profile pixels whose intensity values are in a region also occupied by the intensity threshold value are selected as evaluation pixels, e) based on the evaluation pixels, a curve of continuous intensity as a function of the position coordinate is calculated for the region, f) the position coordinate at which the intensity value of the continuous intensity curve matches the threshold value from step e) is taken as a first position coordinate, g) the distance is determined between the first position coordinate and the position coordinate of the evaluation pixel that, from among the evaluation pixels selected in step d), has the closest intensity value to the threshold value, h) the determined distance is compared to a given maximum, and if the distance is greater than the maximum, the process proceeds to step i), and if the distance is not greater than the maximum, the process proceeds to step k), i) a shift is effected in such a way that the profile function from step b) is present as a shifted profile function that is shifted relative to the pixel coordinates depending on the distance determined in step g) or the distances determined in steps g), and the respective intensity values of the shifted profile function that are present at each pixel coordinate are now set as the intensity values of the profile pixels, and the process then proceeds to steps d)-h), and k) the position of the edge in the captured image is determined with subpixel accuracy from all the distances determined in step g).

This iterative process makes it possible to perform the desired position determination with subpixel accuracy in few iteration steps, reduce noise, and thus permitting a high accuracy in the position determination.

Implementations of the process can include one or more of the following features. The number of evaluation pixels in step d) can be, for example, 5, 7, 9 or more.

The calculation of the continuous profile function in step b) can be performed by interpolation or by a best-fit calculation. The continuous intensity curve of step e) can be determined by using a best-fit calculation. This can be performed quickly, and, as a whole, leads to the desired subpixel-accurate position determination.

The evaluation pixels can be determined in step d) by selecting as a first evaluation pixel the profile pixel whose intensity value is closest to the intensity threshold value, and selecting a given number of adjacent profile pixels as additional evaluation pixels associated with this first evaluation pixel.

This manner of selecting the evaluation pixels can be performed quickly by computation.

The shift of step i) can be performed by interpolation, for example, either a spline or a Fourier interpolation. In the case of Fourier interpolation, a linearly frequency dependent phase component is added to effect the shift in the Fourier spectrum, the gradient of this added phase being directly proportional to the shift.

In step i), the profile function can be shifted. This is also easy to perform computationally.

The shift of step i) can, in particular, be executed in such a way that the shifted profile function is shifted relative to the pixel coordinates by the negative of the sum of all the distances determined in steps g).

In general, in another aspect, a device for subpixel-accurate determination of the position of an edge of a marker structure in a captured image of the marker structure that includes image pixels is provided, the device including an evaluation module that performs the following steps:

a) deriving a discrete intensity profile of the edge, having profile pixels, from the image pixels along a position coordinate, b) calculating, on the basis of the profile pixels, a continuous profile function of the edge as a function of the position coordinate, c) establishing as evaluation pixels, from the profile pixels, adjacent profile pixels whose intensity values are in a region also occupied by the intensity threshold value, d) calculating, on the basis of the evaluation pixels, a curve of continuous intensity as a function of the position coordinate for the region, e) taking as position coordinate the position coordinate at which the intensity value of the continuous intensity curve from step d) matches a threshold value defining the edge position, f) determining the distance between the first position coordinate and the position coordinate of the evaluation pixel that, from among the evaluation pixels selected from step c), has the closest intensity value to the threshold value, g) comparing the determined distance to a given maximum, whereupon, if the distance is greater than the maximum, the evaluation module proceeds to step h), and if the distance is not greater than the maximum, the evaluation module proceeds to step i), h) effecting a shift such that the profile function from step b) is present as a shifted profile function that is shifted relative to the pixel coordinates in dependence on the distance determined in step f) or the distances determined in steps f), and setting as the new intensity value of each profile pixel the intensity value of the shifted profile function that is present at the corresponding pixel coordinate, whereupon the evaluation module proceeds to steps c)-g), and i) determining the position of the edge in the captured image with subpixel accuracy from all the distances determined in step f).

The device can, in particular, be developed in such a way that the advantageous developments of the process according to the invention can also be implemented with the device.

In general, in another aspect, as a second variant of the inventive process, a process for subpixel-accurate determination of the position of an edge of a marker structure in a captured image of the marker structure including image pixels is provided, wherein a) a discrete intensity profile of the edge, having profile pixels, is derived from the image pixels along a position coordinate, b) a continuous profile function of the edge as a function of the position coordinate is calculated on the basis of the profile pixels, c) an intensity threshold value defining the edge position is set, d) the position coordinate at which the intensity value of the continuous profile function from step b) matches the threshold value is taken as a first position coordinate of a first evaluation pixel, e) additional evaluation pixels are defined by setting additional evaluation pixel coordinates for them at predetermined distances starting from the first position coordinate and by assigning the additional evaluation pixels the corresponding intensity values of the profile function at the evaluation pixel coordinates, f) a line of best fit to the evaluation pixels is calculated, g) a second position coordinate is determined at which the intensity value of the line of best fit matches the threshold value, and h) based on the second position coordinate, the position of the edge in the captured image is determined with subpixel accuracy.

This process also lends itself to fast, accurate position determination, since effective noise suppression takes place.

Implementations of the process can include one or more of the following features. In step b), the calculation of the continuous profile function can be performed by using a best-fit calculation or an interpolation. In particular, all the predetermined distances in step e) can be of equal magnitude. The predetermined distances in step e) can respectively be equal to the distances between the profile pixels of the discrete intensity profile from step a).

In general, in another aspect, as a second variant of the inventive device, a device for subpixel-accurate determination of the position of an edge of a marker structure in a captured image of the marker structure including image pixels is provided, the device including an evaluation module that performs the following steps:

a) deriving a discrete intensity profile of the edge, having a multiplicity of profile pixels, from the image pixels along a position coordinate, b) calculating a continuous profile function of the edge as a function of the position coordinate on the basis of the profile pixels, c) taking as a first position coordinate of a first evaluation pixel the position coordinate at which the intensity value of the continuous profile function from step b) matches a threshold value defining the edge position, d) defining additional evaluation pixels by setting additional evaluation pixel coordinates for them at predetermined distances starting from the first position coordinate and assigning the additional evaluation pixels the corresponding intensity values of the profile function at the evaluation pixel coordinates, e) calculating a line of best fit to the evaluation pixels, f) establishing a second position coordinate at which the intensity value of the line of best fit matches a threshold value defining the edge position, and g) determining the position of the edge in the captured image with subpixel accuracy on the basis of the second position coordinate.

Rapid subpixel-accurate position determination is feasible with this device.

In general, in another aspect, as a third variant of the inventive process, a process for subpixel-accurate determination of the position of an edge of a marker structure in a captured image of the marker structure including image pixels is provided, wherein a) a discrete intensity profile of the edge, having profile pixels, is derived from the image pixels along a position coordinate, b) to smooth the discrete intensity profile for each profile pixel, a new intensity value is calculated in dependence on the original intensity values of adjacent profile pixels, c) a continuous profile function of the edge is calculated as a function of the position coordinate on the basis of the profile pixels from step b), d) an intensity threshold value defining the edge position is defined, e) the position coordinate at which the intensity value of the continuous profile function matches the threshold value is taken as a first position coordinate, and f) based on the first position coordinate, the position of the edge in the captured image is determined with subpixel accuracy.

Rapid subpixel-accurate position determination is feasible with this process, since effective noise suppression is achieved.

Implementations of the process can include one or more of the following features. To smooth the discrete intensity profile, a convolution can be performed in step b). The convolution function used can have a maximum and can decrease to zero on both sides of the maximum. The decrease can occur in jumps or it can be continuous. In particular, the convolution function can be symmetrical with respect to the maximum.

Particularly, in order to smooth the discrete intensity profile, a sliding average can be computed for each profile pixel in step b). This is a fast way to calculate the smoothed discrete intensity profile.

In step c), the calculation of the continuous profile function can be performed by using a best-fit calculation or an interpolation.

In general, in another aspect, as a third variant of the inventive device, a device for subpixel-accurate determination of the position of an edge of a marker structure in a captured image of the marker structure including image pixels is provided, wherein the device includes an evaluation module that performs the following steps:

a) deriving a discrete intensity profile of the edge, having profile pixels, from the image pixels along a position coordinate, b) calculating a new intensity value for each profile pixel in dependence on the original intensity values of adjacent profile pixels in order to smooth the discrete intensity profile, c) calculating a continuous profile function of the edge as a function of the position coordinate on the basis of the profile pixels from step b), d) taking as a first position coordinate the position coordinate at which the intensity value of the continuous profile function matches a threshold value defining the edge position, and e) determining the position of the edge in the captured image with subpixel accuracy on the basis of the first position coordinate.

Implementations of the device can include one or more of the following features. The position determination according to the inventive process and the inventive device is preferably performed in relation to a reference point that is predefined. The reference point can be a specific point on the substrate on which the marker structure is disposed. A second marker structure can also be used as a reference point. For example, a distance between two marker structures can also be determined. Furthermore, the respective positions of two edges of one and the same marker structure can be determined with subpixel accuracy, such that from these data the distance between the two edges of the marker structure can be determined with subpixel accuracy.

In the processes and devices according to the invention, the recited steps bring about noise reduction, thus improving the accuracy of the position determination.

In the inventive process according to the third variant, if the convolution function used is a rectangular function having the same number of pixels as the number of evaluation pixels used in step d) of the iterative process according to the first variant, the inventive iterative process according to the first variant is mathematically equivalent to the inventive process according to the third variant. The same naturally applies to the steps performed by the evaluation model of the device according to the third variant, compared to the steps performed by the evaluation module of the device according to the first variant. Furthermore, it can be demonstrated that assuming equal noise, the reproducibility of the position determination can be the same with all three variants.

If the profile of the edges whose position is to be determined with subpixel accuracy is a linear profile, the same subpixel-accurate position is determined with all three variants.

The devices according to the second and third variants can be developed in such a way that the advantageous developments of the inventive process in the second and third variants can be implemented with them.

It is understood that the features recited above and described subsequently below can be used not only in the stated combinations, but also in other combinations or individually without departing from the scope of the invention.

DESCRIPTION OF DRAWINGS

The invention will now be described exemplarily in greater detail with reference to the appended drawings.

DETAILED DESCRIPTION

Figure 1:
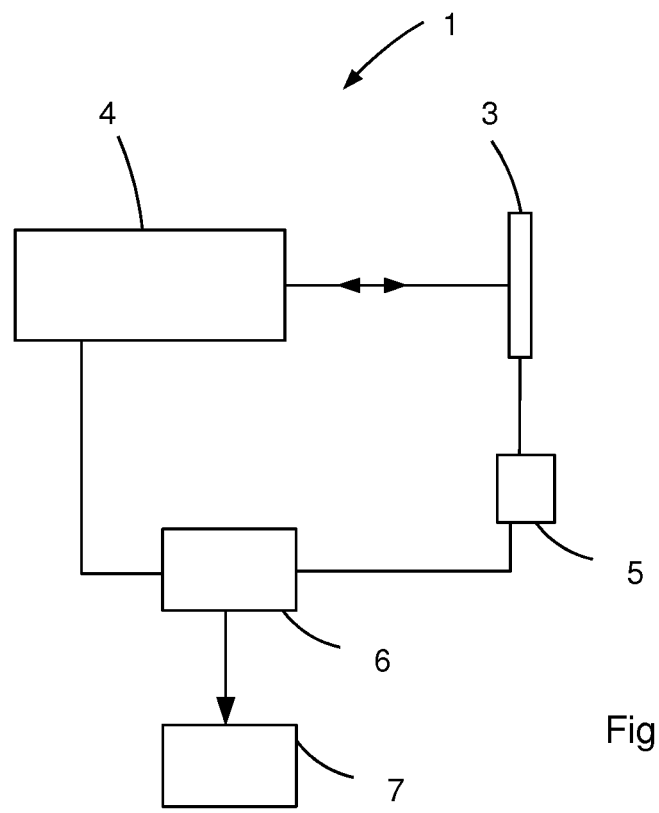
FIG. 1 is a schematic view of an embodiment of the inventive device for subpixel-accurate position determination.

In the embodiment illustrated schematically in FIG. 1, the inventive measuring device 1 for determining the position of an edge of a marker structure 2 on a lithographic mask 3 (or on a substrate 3) includes an image capture device 4 in which images of portions of the lithography mask 3 (e.g., by using a charge coupled device (CCD) detector, not shown) can be captured with magnification, a positioning device 5 that is able to adjust the position or location of the lithographic mask 3 relative to the image capture device 4 in a controlled manner, and a control unit 6 for controlling the measuring device 1.

Figure 2:
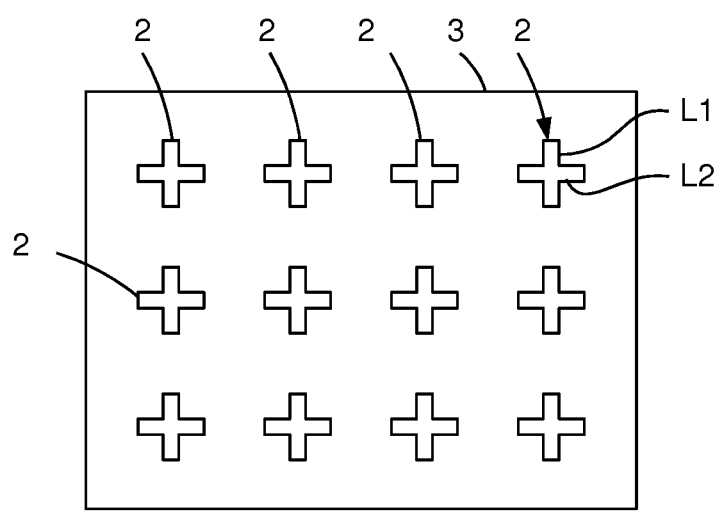
FIG. 2 is a schematic plan view of the lithographic mask in FIG. 1.

FIG. 2 is a schematic plan view of the lithographic mask 3, in which the marker structures 2 are greatly enlarged and thus not true to scale. The marker structures 2 here are plus-sign-shaped, with two intersecting bars L1 and L2, and serve, for example, to check and/or justify the lithographic mask 3, and measure approximately 10 μm×10 μm, assuming a size for the mask 3 of approximately 100 mm×150 mm. The mask structures relevant for the exposure are disposed between the marker structures 2, and for purposes of simplification are not shown here.

To determine the position of an edge of the marker structure 2, an image of the marker structure 2 is captured by using the image capture device 4, the positioning device 5 being used to move and position the lithographic mask 3 relative to the image capture device 4 with high accuracy. The image data from the captured image, which, in this case, by virtue of the CCD detector, includes image pixels arranged in rows and columns, are routed to the control unit 6, as are the position data from the positioning device 5. The control unit 6 redirects these data to an evaluating device 7 according to the invention.

Figure 3:
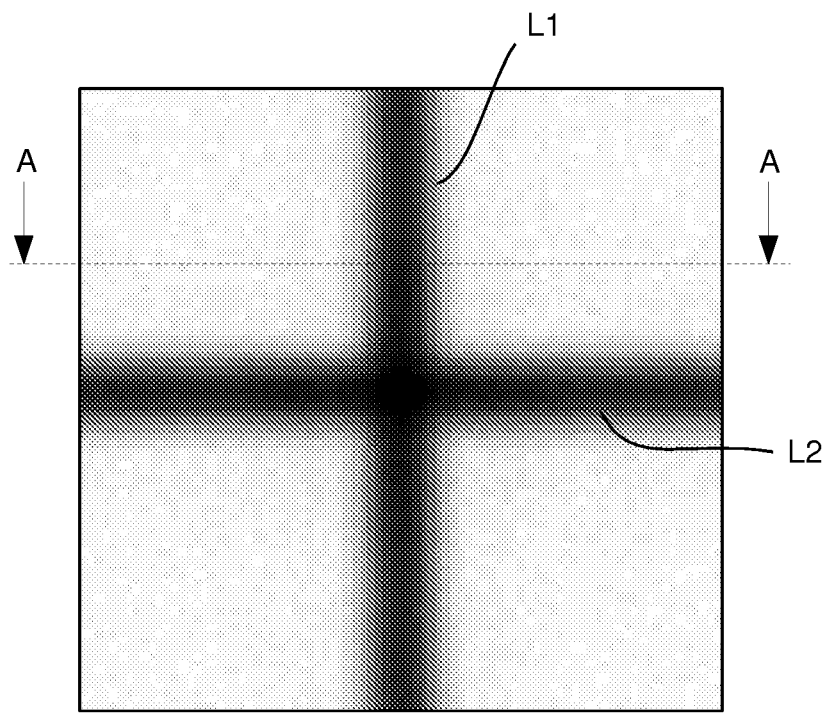
FIG. 3 is a captured image of a marker structure.

FIG. 3 schematically depicts the captured image of a marker structure 2, in which the darker the representation of a given image pixel, the higher the absorbed intensity.

The illustration of FIG. 3 can, for example, represent the captured image of a dark field mask. The inventive process and the inventive device naturally are not limited to this, and can also, for example, be used for bright field masks.

Figure 4:
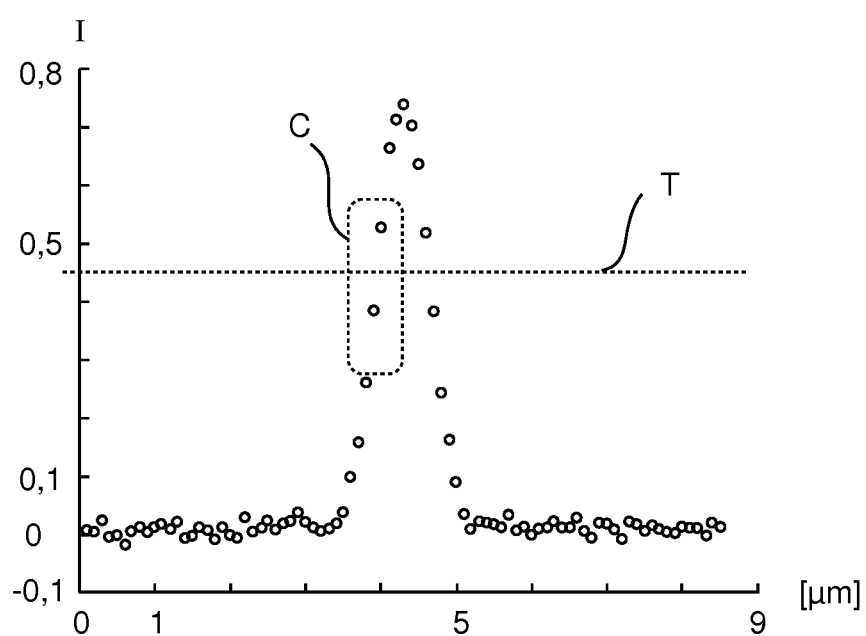
FIG. 4 shows the discrete intensity profile of the image along section line A-A of FIG. 3.

The discrete intensity profile along section line A-A in FIG. 3 is depicted schematically in FIG. 4, each pixel value being represented by a circle. For purposes of simplification, not all the profile pixels are represented. In FIG. 4, the position coordinate in μm is plotted along the x-axis, and the intensity I in relative units is plotted along the y-axis. Also indicated in FIG. 4 is the intensity threshold value T specified in order to define the position of the edge. In the example being described here, the extent in the x-direction of the region captured by each pixel is 25 nm, so the image of the edge was captured with a resolution of 25 nm in the x-direction.

As can be seen from the schematic representation of FIG. 4, both the left and the right edges are located between two profile pixels. Region C is illustrated enlarged in the next figure, FIG. 5, in which the profile pixels of the discrete intensity profile are numbered consecutively from 1 to 9. The width of each profile pixel is 25 nm. Since each profile pixel P is assigned the center (in the x-direction) as its designated position coordinate, the position coordinates of adjacent profile pixels P are 25 nm apart.

Figure 5:
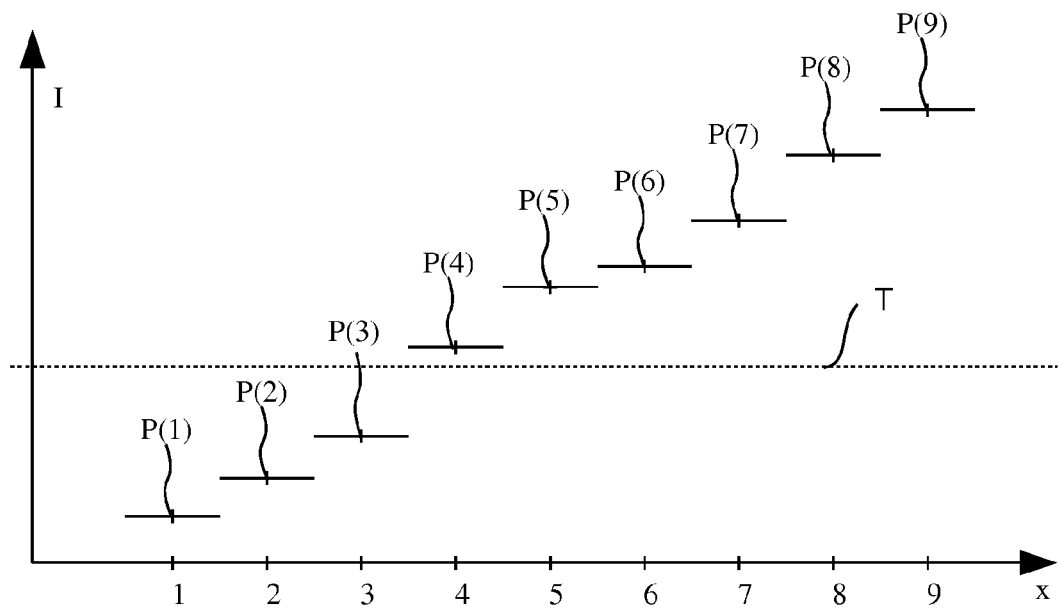
FIGS. 5-9 are graphic representations illustrating the subpixel-accurate position determination.

The first step is to select the pixel P whose intensity value is closest to the threshold value T. In the example of FIG. 5, this is the fourth pixel P(4). This fourth profile pixel P(4) and the two profile pixels P(2), P(3), P(5) and P(6) adjacent to it on each side are selected as evaluation pixels.

Figure 6:
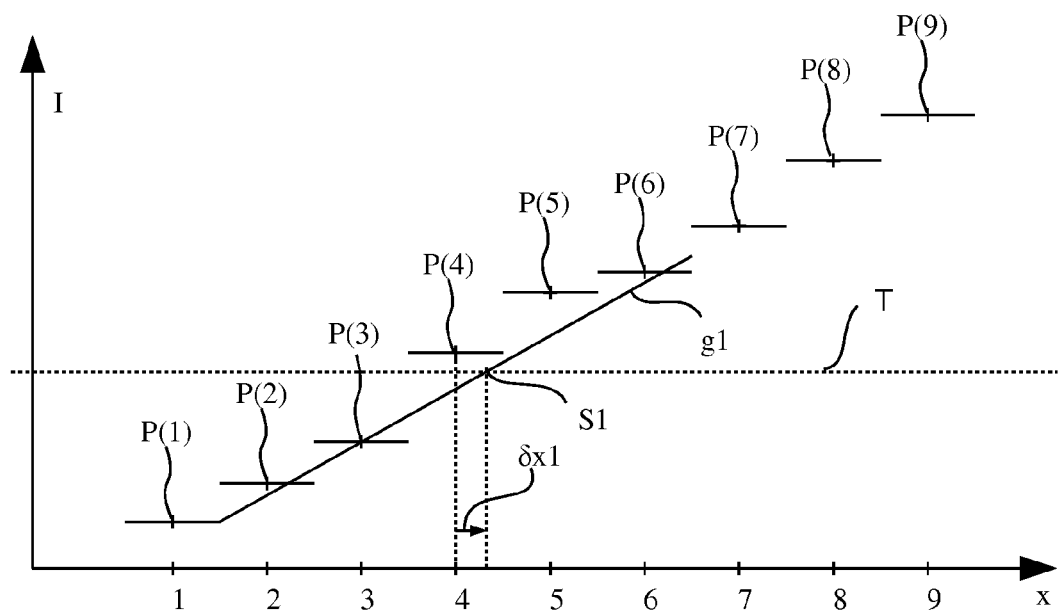

A line of best fit to these five evaluation pixels P(2)-P(6) is calculated, as illustrated in FIG. 6. The intersection point 51 of the line of best fit g1 with the threshold value T or the threshold value line T is then determined, followed by the distance δx1 along the x-direction between the intersection point 51 and the profile pixel P(4) whose intensity value is closest the threshold value T.

It is then determined whether the magnitude of distance δx1 is greater than a threshold e.

If this is not the case, the determined distance δx1 and any additional determined distances, as will be described below, are added to the position coordinate of the pixel P(4) to obtain the edge position with subpixel accuracy. The edge position can be determined, for example, in relation to a reference point of the mask 3 (the left edge of the mask 3, for example), factoring in the position data from the positioning device.

If δx1 is greater than e, a continuous profile function p(x) of the edge is shifted by −δx1. The continuous profile function p(x) of the edge, which is calculated as a function of the position coordinate on the basis of profile pixels P(1)-P(9), is plotted in FIG. 7. The profile function p(x) was obtained in this case, for example, by linear interpolation between every two adjacent profile pixels P. The profile function p(x) can also be obtained using spline interpolation. The shift of the continuous profile function p(x) is indicated in FIG. 8, the shifted profile function p'(x) being shown as a dashed line. The next operation is to determine the intensity values assumed by the shifted profile function p'(x) at the respective position coordinates of profile pixel P, so that all the profile pixels P(1)-P(9) have modified intensity values. The new intensity values are shown as dashed lines.

Figure 9:
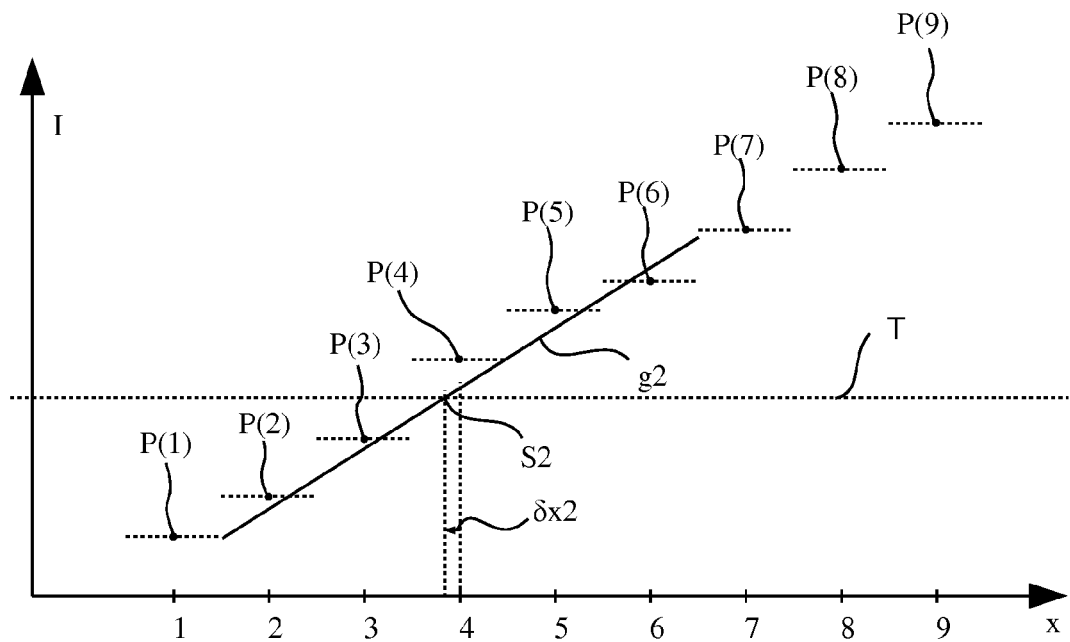

The profile pixel whose intensity value is closest the threshold value T is then determined again. Here again, this is profile pixel P(4). Profile pixel P(4) and the two adjacent profile pixels in each direction are set as evaluation pixels. A line of best fit g2 for these evaluation pixels P(2)-P(6) is again determined, as illustrated in FIG. 9. The intersection point S2 of the line of best fit g2 with the threshold value is determined, as is the distance δx2 from the intersection point S2 to the position coordinate of the central pixel P(4). If the determined distance δx2 is not greater than the threshold e, the process is terminated and the edge position is determined with subpixel accuracy on the basis of all the determined distances δx, as described above.

If, however, the determined distance δx2 is greater than the threshold e, the already shifted profile function is shifted by $-\delta x_2$, the new intensity values of the profile pixels P are determined in the same way as in FIG. 8, and the distance δx is then determined in the same manner as in FIG. 9. This is repeated until δx is no longer greater than the threshold e. The position of the edge is then determined with subpixel accuracy from all the determined distances.

The position of the right edge can also be determined with subpixel accuracy by the above method. In particular, it is also possible to set the arithmetic average of the two edge positions as the position of the vertical bar L1 (FIG. 3) of the marker structure 2.

Figure 10:
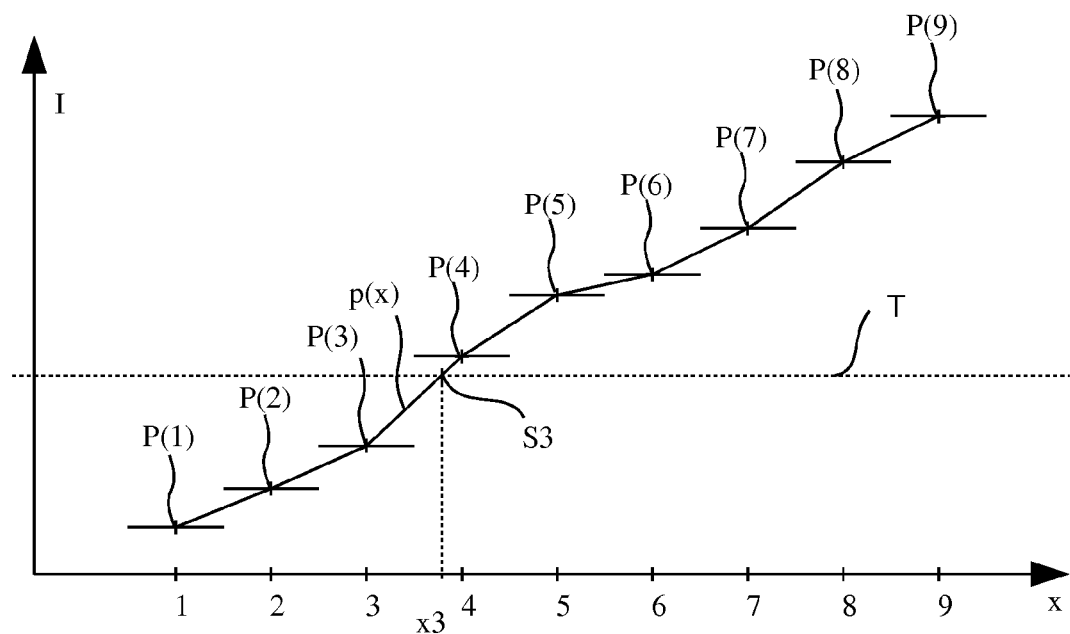
FIGS. 10-12 are graphic representations illustrating another embodiment for effecting subpixel-accurate position determination.

The positions of the edges can also be determined as follows. Proceeding from the discrete intensity profile of FIG. 3, the continuous profile function p(x) of the edge is calculated for region C as a function of the position coordinate x, and thus on the basis of profile pixels P(1)-P(9), as illustrated in FIG. 10.

Figure 11:
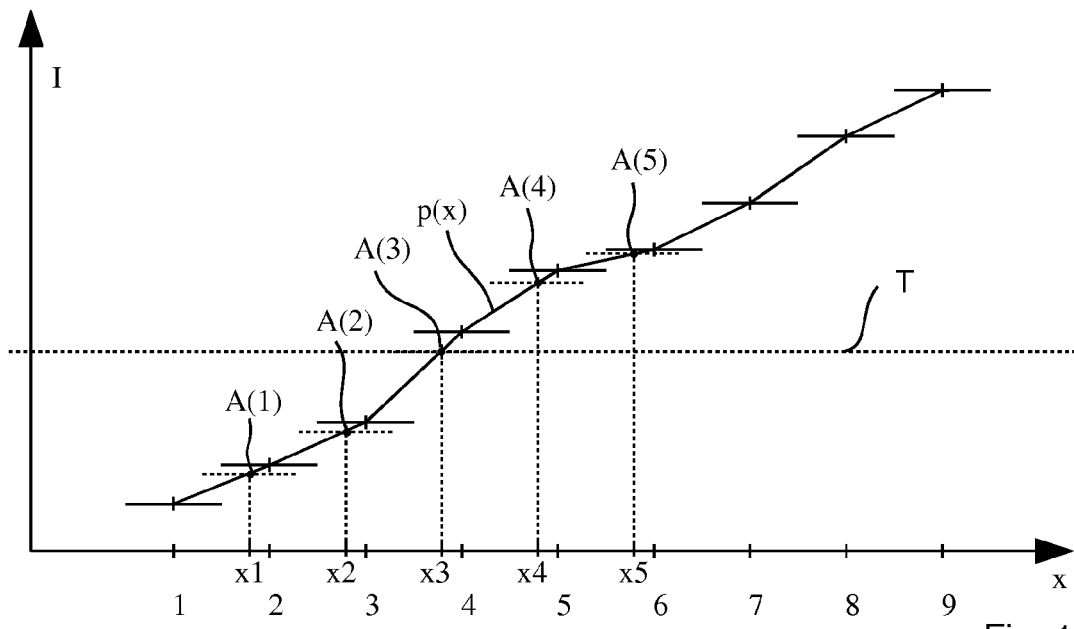

The intersection point S3 of the continuous profile function p(x) with the threshold value T is then determined. The position coordinate x3 of the intersection point S3 serves as the starting point for defining additional evaluation pixels whose distance from the position coordinate x3 is, in each case, a whole multiple of the distance of pixel P. Here, two additional pixels are determined to the left and to the right, as indicated in FIG. 11. The intensity values of the profile function p(x) at the position coordinates selected in this way are determined, resulting in the designation of five evaluation pixels A(1)-A(5).

Figure 12:
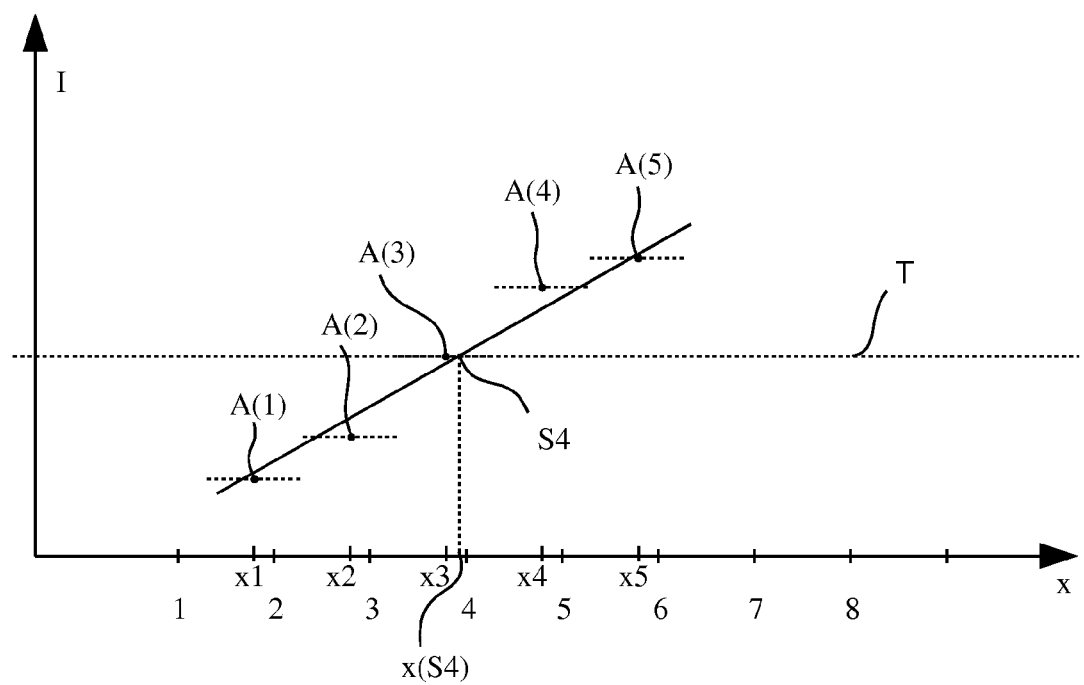

A line of best fit g3 is determined for evaluation pixels A(1)-A(5), and the intersection point S4 of the line of best fit g3 with the threshold value T is located (FIG. 12). The position coordinate x(S4) of the intersection point S4 is then used to calculate the edge position with subpixel accuracy.

Figure 13:
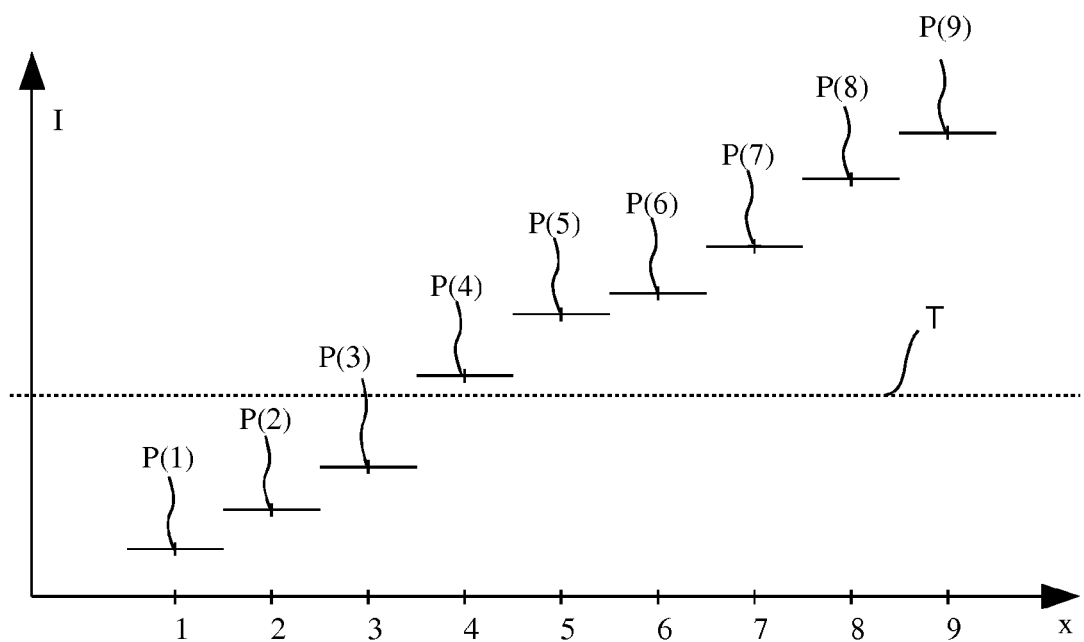
FIGS. 13-15 are graphic representations illustrating another embodiment for effecting subpixel-accurate position determination.
Figure 14:
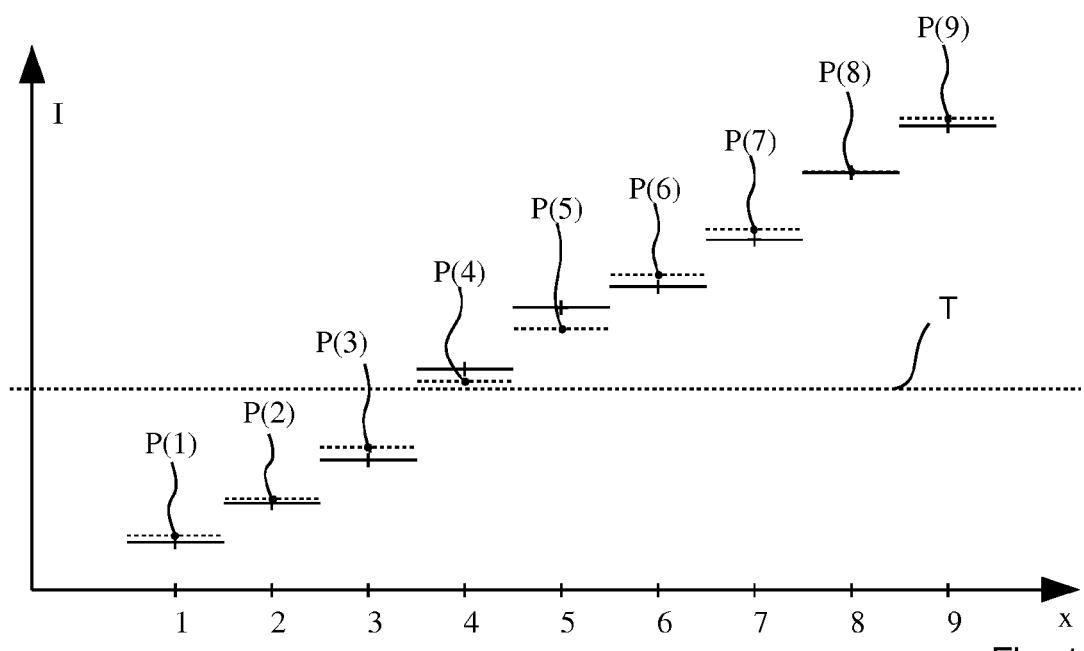
Figure 15:
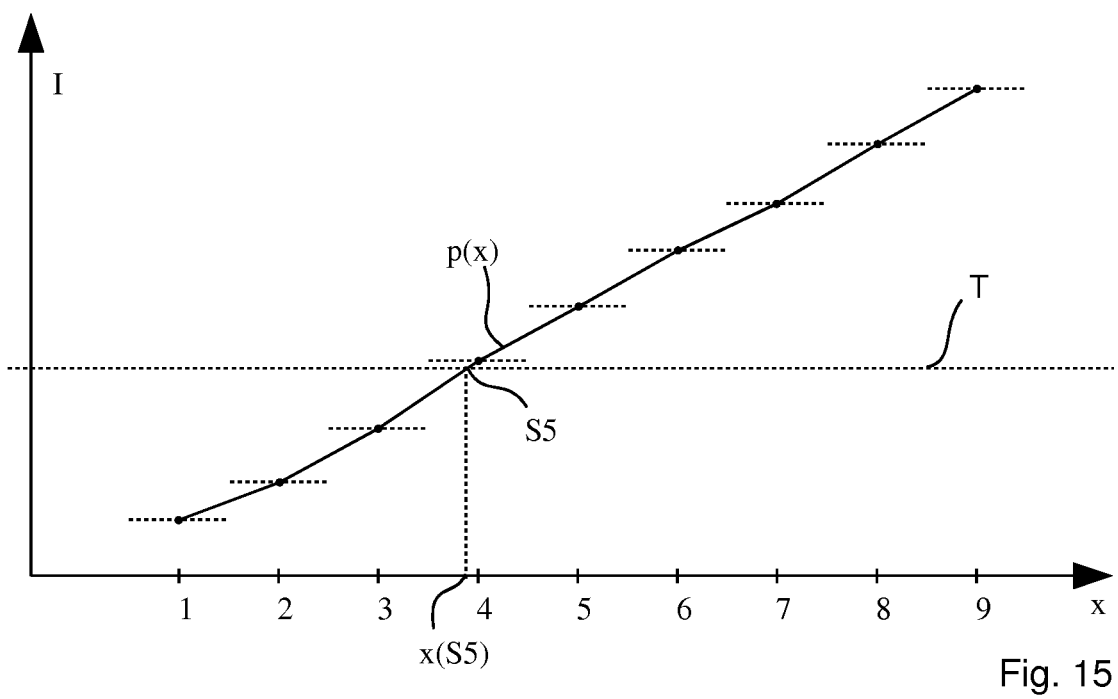

The edge position can further be determined as follows. First, region C is selected from the discrete intensity profile of FIG. 3 (FIG. 13). The profile pixels p selected in this way form a discrete pixel profile, which is smoothed by computing a sliding average over (in this case) five profile pixels. The thus smoothed profile is represented schematically in FIG. 14, in which the nine intensity values of the individual profile pixels are shown as dotted lines.

Based on the smoothed profile pixels P, a continuous profile function p(x) is calculated as a function of the position coordinate x. The intersection point of the continuous profile function p(x) with the threshold value T is determined and the corresponding position coordinate x(S5) of the intersection point S5 is then used to perform the subpixel-accurate position determination.

Figure 7:
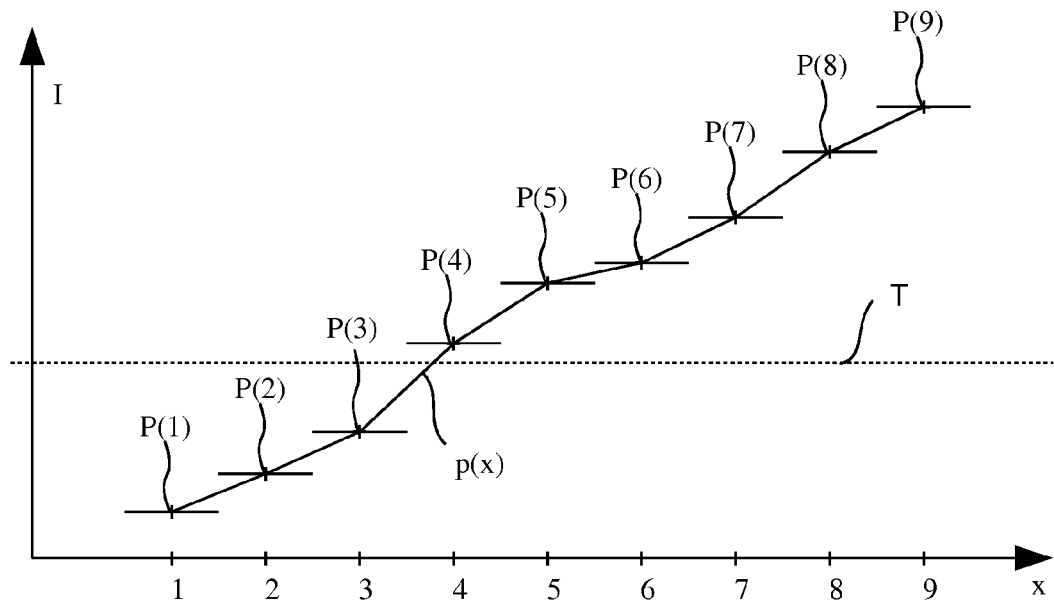
Figure 8:
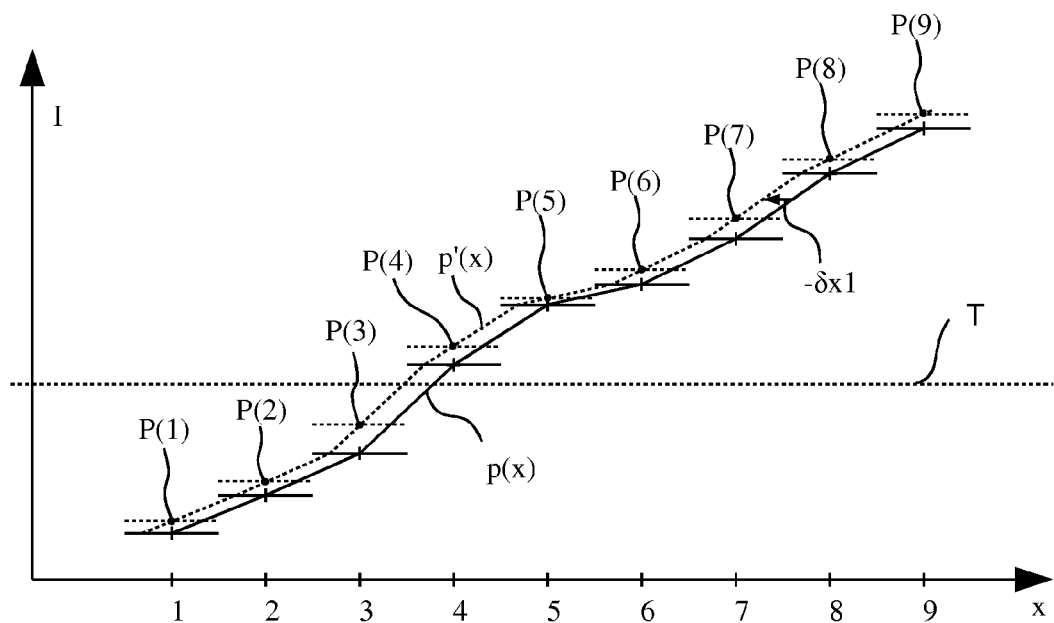

The features described above related to processing of data, such as determining the line of best fit g1 in FIG. 6, calculating the distance δx1, determining the continuous profile function p(x) in FIG. 7, and various other calculations described above, can be performed by the evaluating device 7 of FIG. 1, which can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

A number of implementations have been described. Nevertheless, it will be understood that various modifications may be made. For example, elements of one or more implementations may be combined, deleted, modified, or supplemented to form further implementations. As yet another example, the data processing sequences depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method for determining, with subpixel accuracy, the position of an edge of a marker structure in a captured image of the marker structure comprising a plurality of image pixels, the method comprising:

a) deriving a discrete intensity profile of the edge, having a plurality of profile pixels, from the image pixels along a position coordinate, b) calculating a continuous profile function of the edge as a function of the position coordinate on the basis of the profile pixels, c) specifying an intensity threshold value defining the edge position, d) from the multiplicity of profile pixels, selecting a plurality of adjacent profile pixels whose intensity values lie in a region that encompasses the intensity threshold value as evaluation pixels, e) based on the evaluation pixels, calculating a curve of continuous intensity as a function of the position coordinate for the region, f) selecting the position coordinate at which the intensity value of the continuous intensity curve from step e) matches the threshold value as a first position coordinate, g) determining the distance between the first position coordinate and the position coordinate of the evaluation pixel that, from among the evaluation pixels selected in step d), has the closest intensity value to the threshold value, h) comparing the determined distance to a predetermined threshold, and if the distance is greater than the threshold, the process proceeds to step i), and if the distance is not greater than the threshold, the process proceeds to step k), i) effecting a shift in such a way that the profile function from step b) is present as a shifted profile function that is shifted relative to the pixel coordinates in dependence on the distance determined in step g) or the distances determined in steps g), and the respective intensity values of the shifted profile function that are present at each pixel coordinate are now set as the intensity values of the profile pixels, and the process then proceeds to steps d)-h), and k) determining the position of the edge in the captured image with subpixel accuracy from all the distances determined in step g).

2. The method of claim 1, wherein calculating a continuous profile function of the edge in step b) comprises performing an interpolation or a best-fit calculation in order to calculate the continuous profile function.

3. The method of claim 1, wherein selecting the evaluation pixels in step d) comprises determining the evaluation pixels by selecting as a first evaluation pixel the profile pixel whose intensity value is closest to the intensity threshold value, and selecting a given number of adjacent profile pixels as additional evaluation pixels associated with this first evaluation pixel.

4. The method of claim 1, wherein calculating a curve of continuous intensity in step e) comprises determining the continuous intensity curve by using a best fit calculation.

5. The method of claim 1, wherein effecting a shift in step i) comprises shifting the profile function.

6. The method of claim 1, wherein effecting a shift in step i) comprises effecting the shift in such a way that the shifted profile function is shifted by the negative of the sum of all the distances determined in steps g).

7. A device for subpixel-accurate determination of the position of an edge of a marker structure in a captured image of the marker structure comprising a plurality of image pixels, the device comprising an evaluation module that performs operations comprising:

a) deriving a discrete intensity profile of the edge, having a plurality of profile pixels, from the image pixels along a position coordinate, b) calculating, on the basis of the profile pixels, a continuous profile function of the edge as a function of the position coordinate, c) selecting as evaluation pixels, from the plurality of profile pixels, a plurality of adjacent profile pixels whose intensity values are in a region that encompasses an intensity threshold value, d) calculating, on the basis of the evaluation pixels, a curve of continuous intensity as a function of the position coordinate for the region, e) taking as position coordinate the position coordinate at which the intensity value of the continuous intensity curve from step d) matches a threshold value defining the edge position, f) determining the distance between the first position coordinate and the position coordinate of the evaluation pixel that, from among the evaluation pixels selected in step c), has the closest intensity value to the threshold value, g) comparing the determined distance to a predetermined threshold, whereupon, if the distance is greater than the threshold, the evaluation module proceeds to step h), and if the distance is not greater than the threshold, the evaluation module proceeds to step i), h) effecting a shift such that the profile function from step b) is present as a shifted profile function that is shifted relative to the pixel coordinates in dependence on the distance determined in step f) or the distances determined in steps f), and setting as a new intensity value of each profile pixel the intensity value of the shifted profile function that is present at the corresponding pixel coordinate, whereupon the evaluation module then proceeds to steps c)-g), and i) determining the position of the edge in the captured image with subpixel accuracy from all the distances determined in step f).

8. A method for determining, with subpixel accuracy, the position of an edge of a marker structure in a captured image of the marker structure comprising a multiplicity of image pixels, the method comprising:

a) deriving a discrete intensity profile of the edge, having a plurality of profile pixels, from the image pixels along a position coordinate, b) calculating a continuous profile function of the edge as a function of the position coordinate is calculated on the basis of the profile pixels, c) setting an intensity threshold value defining the edge position, d) selecting the position coordinate at which the intensity value of the continuous profile function from step b) matches the threshold value as a first position coordinate of a first evaluation pixel, e) defining additional evaluation pixels by setting additional evaluation pixel coordinates for the additional evaluation pixels at predetermined distances starting from the first position coordinate and by assigning the additional evaluation pixels the corresponding intensity values of the profile function at the evaluation pixel coordinates, f) determining a line of best fit to the evaluation pixels, g) determining a second position coordinate at which the intensity value of the line of best fit matches the threshold value, and h) determining, based on the second position coordinate, the position of the edge in the captured image with subpixel accuracy.

9. The method of claim 8, wherein calculating a continuous profile function of the edge in step b) comprises performing a best-fit calculation or an interpolation.

10. The method of claim 8, wherein defining additional evaluation pixels in step e) comprises setting additional evaluation pixel coordinates for the additional evaluation pixels at predetermined distances, the predetermined distances being of equal magnitude.

11. The method of claim 8, wherein defining additional evaluation pixels in step e) comprises setting additional evaluation pixel coordinates for the additional evaluation pixels at predetermined distances, the predetermined distances being equal to the distance between the profile pixels of the discrete intensity profile from step a).

12. A device for determining, with subpixel accuracy, the position of an edge of a marker structure in a captured image of the marker structure comprising a multiplicity of image pixels, the device comprising an evaluation module that performs operations comprising:

a) deriving a discrete intensity profile of the edge, having a plurality of profile pixels, from the image pixels along a position coordinate, b) calculating a continuous profile function of the edge as a function of the position coordinate on the basis of the profile pixels, c) selecting as a first position coordinate of a first evaluation pixel the position coordinate at which the intensity value of the continuous profile function from step b) matches a threshold value defining the edge position, d) defining additional evaluation pixels by setting additional evaluation pixel coordinates for them at predetermined distances starting from the first position coordinate and assigning the additional evaluation pixels the corresponding intensity values of the profile function at the evaluation pixel coordinates, e) calculating a line of best fit to the evaluation pixels, f) determining a second position coordinate at which the intensity value of the line of best fit matches a threshold value defining the edge position, and g) determining the position of the edge in the captured image with subpixel accuracy on the basis of the second position coordinate.

13. A method for determining, with subpixel accuracy, the position of an edge of a marker structure in a captured image of the marker structure comprising a multiplicity of image pixels, the method comprising:

a) deriving a discrete intensity profile of the edge, having a multiplicity of profile pixels, from the image pixels along a position coordinate, b) calculating a new intensity value for each profile pixel in dependence on the original intensity values of adjacent profile pixels in order to smooth the discrete intensity profile, c) calculating a continuous profile function of the edge as a function of the position coordinate on the basis of the profile pixels from step b), d) setting an intensity threshold value defining the edge position, e) selecting the position coordinate at which the intensity value of the continuous profile function matches the threshold value as a first position coordinate, and f) determining, based on the first position coordinate, the position of the edge in the captured image with subpixel accuracy.

14. The method of claim 13, wherein calculating a new intensity value for each profile pixel in step b) comprises performing a convolution in order to smooth the discrete intensity profile.

15. The method of claim 13, wherein calculating a new intensity value for each profile pixel in step b) comprises computing a sliding average for each profile pixel in order to smooth the discrete intensity profile.

16. The method of claim 13, wherein calculating a continuous profile function of the edge in step c) comprises performing a best-fit calculation or an interpolation.

17. A device for determining, with subpixel accuracy, the position of an edge of a marker structure in a captured image of the marker structure comprising a multiplicity of image pixels, the device comprising an evaluation module that performs operations comprising:

a) deriving a discrete intensity profile of the edge, having a multiplicity of profile pixels, from the image pixels along a position coordinate, b) calculating a new intensity value for each profile pixel in dependence on the original intensity values of adjacent profile pixels in order to smooth the discrete intensity profile, c) calculating a continuous profile function of the edge as a function of the position coordinate on the basis of the profile pixels from step b), d) selecting as a first position coordinate the position coordinate at which the intensity value of the continuous profile function matches a threshold value defining the edge position, e) determining the position of the edge in the captured image with subpixel accuracy on the basis of the first position coordinate.

18. A method of determining the position of an edge of a marker structure in an image, the method comprising:

determining a discrete intensity profile of an edge of a marker structure from an image of the marker structure, the discrete intensity profile having profile pixels that correspond to pixel coordinates;

determining a continuous profile of the edge based on at least some of the profile pixels;

determining a curve of continuous intensity based on at least some of the profile pixels whose intensity values lie in a neighborhood of an intensity threshold value;

iteratively shifting the continuous profile of the edge relative to the pixel coordinates, setting respective intensity values of the shifted profile function that are present at each pixel coordinate as the intensity values of the profile pixels, the amount of shifting being based on a predetermined relationship between the curve of continuous intensity and the profile pixels, and updating the curve of continuous intensity based on at least some of the profile pixels whose intensity values lie in the neighborhood of the intensity threshold value, the iteration terminating when a predetermined condition is met; and determining a position of the edge of the marker structure in the image with subpixel accuracy based on the amount of shifting occurred during the iterative shifting process.

19. The method of claim 18 in which the predetermined relationship comprises a distance between a first coordinate and a second coordinate, the continuous intensity curve matching the intensity threshold value at the first coordinate, and the second coordinate corresponding to the profile pixel that has an intensity value closest to the threshold value.

20. The method of claim 19, comprising terminating the iteration when the distance between the first and second coordinates is smaller than a predetermined threshold.

21. The method of claim 18 in which determining a curve of continuous intensity comprises determining a curve of continuous intensity based on a best fit calculation of at least some of the profile pixels.

22. The method of claim 18 in which determining a continuous profile of the edge comprises performing an interpolation or a best-fit calculation on the profile pixels to determine a continuous profile of the edge.

* * * * *

UNITED STATES PATENT AND TRADEMARK OFFICE
CERTIFICATE OF CORRECTION

| | |
|---|---|
| PATENT NO. | : 8,457,411 B2 |
| APPLICATION NO. | : 12/749938 |
| DATED | : June 4, 2013 |
| INVENTOR(S) | : Michael Arnz |

Page 1 of 1

It is certified that error appears in the above-identified patent and that said Letters Patent is hereby corrected as shown below:

In the Specifications:

<u>Column 7</u>

Line 17, delete "51" and insert -- S1 --

Line 21, delete "51" and insert -- S1 --

Signed and Sealed this
Twentieth Day of August, 2013

Teresa Stanek Rea
*Acting Director of the United States Patent and Trademark Office*